United States Patent
Mellinger et al.

(10) Patent No.: US 6,549,060 B1
(45) Date of Patent: Apr. 15, 2003

(54) DYNAMIC LOGIC MUX

(75) Inventors: Todd W. Mellinger, Fort Collins, CO (US); Jonathan E. Lachman, Fort Collins, CO (US); Michael Umphlett, Fort Collins, CO (US)

(73) Assignee: Hewlett Packard Development Company, L.P., Houston, TX (US)

(*) Notice: Subject to any disclaimer, the term of this patent is extended or adjusted under 35 U.S.C. 154(b) by 0 days.

(21) Appl. No.: 10/177,868

(22) Filed: Jun. 19, 2002

(51) Int. Cl.[7] ............................................... H03K 17/62
(52) U.S. Cl. .................... 327/407; 327/200; 327/408
(58) Field of Search .......................... 327/200, 201, 327/407, 408, 409, 411

(56) References Cited

U.S. PATENT DOCUMENTS

| | | | | |
|---|---|---|---|---|
| 5,646,558 A | * | 7/1997 | Jamshidi | 327/408 |
| 5,706,323 A | * | 1/1998 | Miller | 327/407 |
| 5,926,487 A | * | 7/1999 | Chappell et al. | 327/202 |
| 5,933,038 A | * | 8/1999 | Klass | 327/208 |
| 6,320,794 B1 | * | 11/2001 | Kang et al. | 365/189.02 |
| 6,438,051 B1 | * | 8/2002 | Fifield et al. | 327/51 |

OTHER PUBLICATIONS

Charles M. Lee and Ellen W. Szeto, "Zipper CMOS". IEEE Circuits and Devices Magazine, May 1986, pp. 10–17.

* cited by examiner

Primary Examiner—Toan Tran
(74) Attorney, Agent, or Firm—Alexander J. Neudeck

(57) ABSTRACT

A dynamic logic multiplexer has pull-ups on its input signals that pull-up the input signals when not selected. This reduces leakage current that may contribute to incorrect switching of the output. The output stage of the multiplexer includes a latched dynamic node followed by two gain stages, and an open-drain output.

20 Claims, 2 Drawing Sheets

DYNAMIC LOGIC MUX

FIELD OF THE INVENTION

This invention relates generally to digital integrated electronic circuits and more particularly to a digital dynamic multiplexer (MUX).

BACKGROUND OF THE INVENTION

A multiplexer (or MUX, or data selector) has a group of control inputs that is used to select one of a group of data inputs and connect that input, or relay the value on that input, to the output terminal. MUX's have been implemented in many different logic families including static logic families and dynamic logic families. One such implementation of a dynamic logic MUX is shown in FIG. 1.

Unfortunately, the dynamic logic MUX shown in FIG. 1 suffers from at least one problem. Subthreshold leakage current through transistors on the nonselected inputs can cause the output to switch incorrectly. This problem is aggravated when, to increase speed, the process technology is modified to make the threshold voltage of the transistors smaller.

SUMMARY OF THE INVENTION

A dynamic logic multiplexer has pullups on its input signals that pull-up the input signals when not selected. This reduces leakage current that may contribute to incorrect switching of the output. The output stage of the multiplexer includes a latched dynamic node followed by two gain stages, and an open-drain output.

DETAILED DESCRIPTION OF THE PREFERRED EMBODIMENTS

Figure 1:
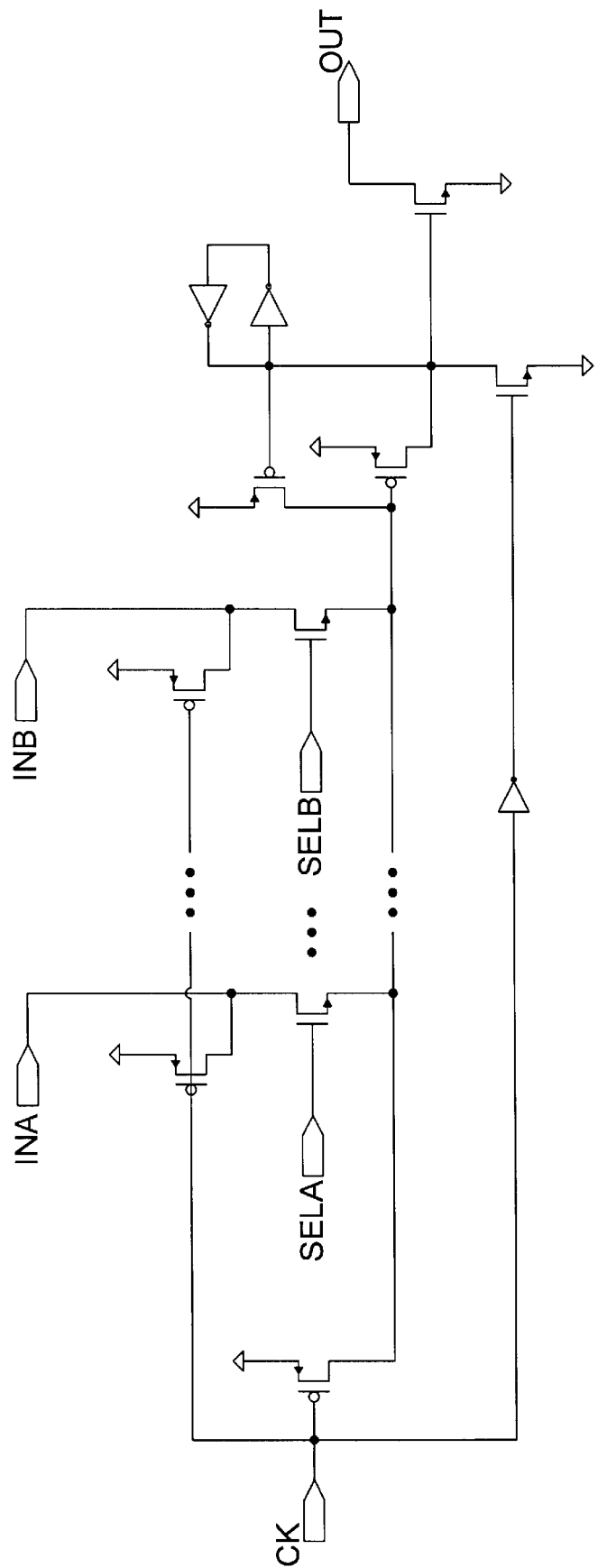
FIG. 1 is a prior art a dynamic logic MUX.

FIG. 1 is a prior art dynamic logic MUX. In FIG. 1, only two data inputs (INA and INB), two control inputs (SELA and SELB) and two input structures (the FETs that are connected to the signals INA and INB, respectively) are shown. However, it is to be understood that these are representative of potentially many more inputs and input structures so that the MUX in FIG. 1 is representative of a multiplexer design with either a large or small number of inputs.

Figure 2:
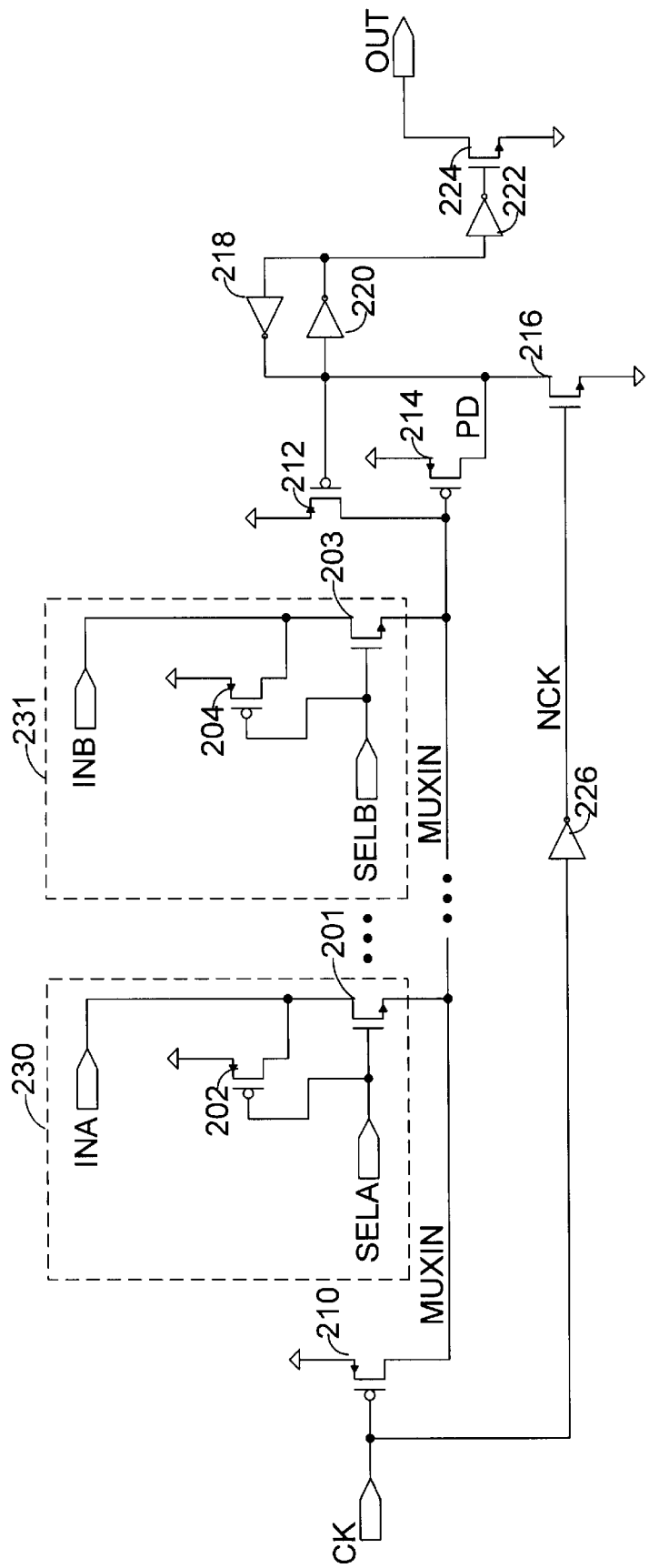
FIG. 2 is a schematic illustration of an improved dynamic logic MUX.

FIG. 2 is a schematic illustration of an improved dynamic logic MUX. In FIG. 2, like FIG. 1, only two data inputs (INA and INB), two control inputs (SELA and SELB) and two input structures (230 and 231) are shown. However, it is to be understood that these are representative of potentially many more inputs and input structures so that the MUX in FIG. 2 is representative of a multiplexer design with either a large or small number of inputs.

In FIG. 2, input CK is connected to the gate of p-channel field-effect transistor (PFET) 210 and the input of inverter 226. The source of PFET 210 is connected to the positive supply voltage and the drain is connected to node MUXIN. Therefore, when CK is at a logical low voltage (which is a low enough voltage to turn PFET 210 on) MUXIN will be precharged to a logical high voltage by PFET 210. When CK is at a logical high voltage (which is high enough to turn PFET 210 off) MUXIN is not being precharged or otherwise pulled-up by PFET 210 and other conduction paths (such as the input structures) are free to pulldown MUXIN to a logical low voltage. Hence, in operation with CK toggling between a logical low voltage and a logical high voltage, MUXIN is a dynamic precharge-pulldown node. Note that in another embodiment, MUXIN may be a dynamic node of the precharge-pullup type.

The output of inverter 226 is connected to node NCK. NCK is also connected to the gate of n-channel field-effect transistor (NFET) 216. The source of NFET 216 is connected to the negative supply voltage and the drain of NFET 216 is connected to node PD. Therefore, when CK is at a logical low voltage, NCK will be a logical high voltage (which is high enough to turn NFET 216 on) PD will be precharged to a logical low voltage via NFET 216. When NCK is at a logical low voltage (i.e. when CK is at a logical high voltage, NCK will be at a logical low voltage which is low enough to turn NFET 216 off) PD is not being precharged or otherwise being pulled-down by NFET 216, other conduction paths are free to pullup PD to a logical high voltage. Hence, in operation with CK and NCK toggling between a logical low voltage and a logical high voltage (and NCK being the inverse of CK), PD is a dynamic precharge-pullup node. Note that in another embodiment, PD may be a dynamic node of the precharge-pulldown type.

In FIG. 2, input structure 230 and 231 are representative input structures. In other words, as discussed above, these two structures may represent many more similarly constructed input structures thereby allowing a large number of signals to be multiplexed. Input structure 230 comprises FETs 201 and 202. Input structure 231 comprises FETs 203 and 204. The control input to the first representative input structure 230 is SELA and the data input is INA. SELA is connected to the gates of NFET 201 and PFET 202. The drains of NFET 201 and PFET 202 are connected to data input INA. The source of PFET 202 is connected to the positive supply voltage. The source of NFET 201 is connected to node MUXIN.

The control input to the second representative input structure 231 is SELB and the data input is INB. SELB is connected to the gates of NFET 203 and PFET 204. The drains of NFET 203 and PFET 204 are connected to data input INB. The source of PFET 204 is connected to the positive supply voltage. The source of NFET 203 is connected to node MUXIN.

Node MUXIN is also connected to the gate of PFET 214 and the drain of PFET 212. The source of PFET 214 is connected to the positive supply voltage and the drain of PFET 214 is connected to precharge-pullup node PD. The gate of PFET 212 is also connected to precharge-pullup node PD. The source of PFET 212 is connected to the positive supply voltage. Precharge-pullup node PD is also connected to the input of inverter 220 and the output of inverter 218. The output of inverter 220 is connected to the input of inverter 218. Therefore, inverters 220 and 218 form a pair of cross-coupled inverters that will hold the logical value (or voltage) on node PD when both PFET 214 and NFET 216 are off.

The output of inverter 220 (and therefore the input of inverter 218) is also connected to the input of inverter 222. The output of inverter 222 is connected to the gate of NFET 224. The drain of NFET 224 is connected to output node OUT. The source of NFET 224 is connected to the negative supply voltage. Accordingly, NFET 224 forms and open drain output structure to pulldown node OUT.

To function properly, SELA and SELB should be controlled to be at a logical low voltage when CK is at a logical low voltage. This will prevent a potential drive-fight on MUXIN between one of the inputs (INA or INB) and PFET 210.

In normal operation, the precharge phase is when CK is at a logical low voltage. In this phase, PFET 210 is on and NFETs 201 and 203 of the input structures are off. This precharges MUXIN to a logical high voltage level. Also during the precharge phase, NFET 216 is on. Once MUXIN precharges, PFET 214 will be off. Therefore, NFET 216 precharges PD to a logical low level during the precharge phase. This logical low on PD turns PFET 212 on which also helps precharge MUXIN to a logical high voltage. The logical low on PD also causes a a logical high voltage on the output of inverter 220. The logical high on the output of inverter 220 causes a logical low voltage on the output of inverter 222. This causes NFET 224 to be off. Finally, when the control inputs of the input structures SELA, SELB are low, PFETs 202 and 204 are on thereby precharging the data inputs INA and INB to a logical high voltage.

When CK transitions to a logical high voltage, it begins the evaluate phase. In other words, the evaluate phase is when CK is at a logical high voltage. When CK is at a logical high voltage, PFET 210 and NFET 216 are both off. Cross-coupled inverters 220 and 210 form a node holder to weakly hold the logical low voltage on node PD unless and until PFET 214 turns on.

To multiplex an input, one of the control inputs to one of the input structures is raised to a logical high voltage. For example, SELA may be raised to a logical high voltage level. This should only be done during the evaluate phase. When SELA is at a logical high voltage level, NFET 201 is on and PFET 202 is off. This allows the voltage level on data input INA to pass through NFET 201 to MUXIN. If data input INA remains at its precharge level of a logical high voltage, MUXIN remains at a logical high voltage, PFET 214 remains off, PD remains at a logical low voltage, the output of inverter 220 remains at a logical high voltage, the output of inverter 222 remains at a logical low voltage, and NFET 224 remains off. If data input INA transitions from its precharge level to a logical low voltage, MUXIN will be pulled to a logical low voltage via the input structure overdriving PFET 212, PFET 214 will turn on, PD will transition to a logical high voltage, the output of inverter 220 will transition to at a logical low voltage, the output of inverter 222 will transition to a logical high voltage, and NFET 224 will turn on. This state will be retained until the end of the evaluate stage when CK transitions to a logical low voltage level and the whole process starts over again.

When comparing FIG. 1 and FIG. 2, note that in FIG. 2, the gate of the input structure precharge PFETs 202 and 204 are connected to the select lines SELA and SELB, respectively, as opposed to FIG. 1 which has the corresponding gates of the precharge PFETs connected to CK. This change serves to hold the non-selected data input nodes at a logical high voltage level (because on the non-selected lines the control input is at a logical low voltage thereby keeping PFET 202, 204, etc. on). This provides a negative gate-to-source voltage on NFETs 201 and 203. This negative gate-to-source voltage reduces leakage current through NFETs 201 and 203 when compared to the multiplexer in FIG. 1. In FIG. 1, leakage through the FETs gated by SELA and SELB to INA and INB which may be at a logical low voltage, may, particularly with high fan-in multiplexers, cause the node in FIG. 1 corresponding to MUXIN to discharge when it should not, thereby producing an incorrect output. Accordingly, the design shown in FIG. 2 has an improved input structure. Note that in FIG. 1 and FIG. 2 these precharge FETs are PFETs. In another embodiment that sought to precharge the data inputs to a logical low voltage level, NFETs may be used as the precharge FETs with an appropriate polarity drive signal.

One issue with keeping PFETs 202 and/or 204 turned on for the nonselected inputs is that it may produce a drive-fight with a circuit that is trying to pull a non-selected data input (INA and/or INB) down. However, as long as the drive strength of what is pulling the data input down is small when compared to the strength of the input structure PFET 202, 204, the data input will stay high and leakage current will remain reduced.

Another change between FIG. 1 and FIG. 2 is the path from PD to the output node OUT. In FIG. 1, the open-drain output NFET has its gate connected directly to the node that corresponds to PD. In FIG. 2, output NFET 224 is driven via a path that starts at PD and goes through two gain stages (in the form of inverter 220 and 222, respectively) before driving the gate of output NFET 224. This increases the circuits noise margin by allowing node MUXIN to droop (from leakage current, coupled noise, or other sources) a greater amount without the gate of the output NFET 224 rising. Choosing an appropriate NFET-to-PFET ratio for the transistors that comprise inverter 220 provides control of the trip point of the circuit. Driving the output NFET via the path with two gain stages as in FIG. 2 also allows an increase in the size of the output NFET 224 and a reduction in the size of PFET 214 when compared to the multiplexer of FIG. 1 while improving the edge rates of the signal at the gate of output transistor 224.

What is claimed is:

1. A dynamic multiplexer, comprising:

a first dynamic node;

a plurality of input structures connected to said first dynamic node;

a second dynamic node coupled to said first dynamic node that is responsive to logical voltage level changes on said first dynamic node during an evaluate phase of operation;

a first and second gain stage connected in series that are responsive to logical voltage level changes on said second dynamic node;

an output transistor controlled by said second gain stage;

and wherein said plurality of input structures comprise a precharge FET controlled by a select signal wherein said precharge FET continues to precharge a non-selected data input during said evaluate phase of operation.

2. The dynamic multiplexer of claim 1 wherein said first dynamic node is a precharge-pulldown node, said second dynamic node is a precharge-pullup node, and said precharge FET is a PFET.

3. The dynamic multiplexer of claim 1 wherein said first dynamic node is a precharge-pullup node, said second dynamic node is a precharge pulldown node, and said precharge FET is a NFET.

4. The dynamic multiplexer of claim 1, comprising:

a node holder connected to said second dynamic node.

5. The dynamic multiplexer of claim 4 wherein said node holder comprises said first gain stage.

6. A multiplexer, comprising:

an input structure that precharges its data input during an evaluate phase when said input structure is not selected and during a precharge phase;

a first dynamic node connected to a plurality of said input structures;

a first gain stage having a first gain input coupled to said first dynamic node and a first gain output;

a second gain stage having a second gain input connected to said first gain output;

an output transistor connected to a second gain stage output.

7. The multiplexer of claim 6 wherein said first gain stage is part of a node holder.

8. The multiplexer of claim 6 wherein said first dynamic node is a precharge-pulldown node and said plurality of input structures precharge said data input to a logical high voltage level.

9. A multiplexer, comprising:

a plurality of input structures wherein said input structures comprise a first switching device of a first type and a second switching device of a second type and said first switching device precharges a data input when a control signal is in a first logical state and said second switching device connects a data input of said input structure to a first dynamic node when said control signal is in a second logical state;

a first gain stage having a first input and a first output, said first input coupled to said first dynamic node;

a second gain stage having a second input coupled to said first output and a second output; and, an output transistor being controlled by said second output.

10. The multiplexer of claim 9, comprising a second dynamic node coupled between said first dynamic node and said first input.

11. The multiplexer of claim 9 wherein said first switching device of a first type is a PFET.

12. The multiplexer of claim 9 wherein said second switching device of a second type is a NFET.

13. The multiplexer of claim 9 wherein said first switching device of a first type is a NFET.

14. The multiplexer of claim 9 wherein said second switching device of a second type is a PFET.

15. The multiplexer of claim 9 wherein said first switching device of a first type is a PFET and said second switching device of a second type is a NFET.

16. The multiplexer of claim 9 wherein said first switching device of a first type is a NFET and said second switching device of a second type is a PFET.

17. The multiplexer of claim 15 wherein said first dynamic node is a precharge-pulldown node.

18. The multiplexer of claim 16 wherein said first dynamic node is a precharge-pullup node.

19. The multiplexer of claim 9 wherein said first gain stage is part of a node holder.

20. The multiplexer of claim 19 wherein said first switching device of a first type is a NFET and said second switching device of a second type is a PFET and said first dynamic node is a precharge-pulldown node.

* * * * *